(12) United States Patent
Maeda et al.

(10) Patent No.: US 7,514,672 B2
(45) Date of Patent: Apr. 7, 2009

(54) CASE FOR ACCOMMODATING SOLID-STATE IMAGING DEVICE AND SOLID-STATE IMAGING APPARATUS

(75) Inventors: Mitsuo Maeda, Tsukuba (JP); Tomohiro Sato, Niihama (JP); Shigehide Yoshida, Niiza (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 2 days.

(21) Appl. No.: 11/276,090

(22) Filed: Feb. 14, 2006

(65) Prior Publication Data

US 2006/0202117 A1    Sep. 14, 2006

(30) Foreign Application Priority Data

Feb. 15, 2005    (JP)    ............................ P2005-037921

(51) Int. Cl.
*H01J 40/14*    (2006.01)
*H01L 27/00*    (2006.01)
(52) U.S. Cl. .................................... 250/239; 250/208.1
(58) Field of Classification Search ................. 250/239, 250/208.1; 257/433, 678, 434, 680, 690, 257/666; 438/64, 106
See application file for complete search history.

(56) References Cited

U.S. PATENT DOCUMENTS

| | | | | |
|---|---|---|---|---|
| 4,967,081 A | * | 10/1990 | Quad et al. | 250/338.1 |
| 5,359,208 A | * | 10/1994 | Katsuki et al. | 257/82 |
| 6,727,431 B2 | * | 4/2004 | Hashimoto | 174/539 |
| 6,774,447 B2 | * | 8/2004 | Kondo et al. | 257/432 |
| 7,198,387 B1 | * | 4/2007 | Gloisten et al. | 362/294 |
| 2004/0262741 A1 | * | 12/2004 | Koike et al. | 257/706 |

FOREIGN PATENT DOCUMENTS

| | | |
|---|---|---|
| JP | 11-330285 A | 11/1999 |
| JP | 2001-148437 | 5/2001 |
| JP | 2004-095982 | 3/2004 |

* cited by examiner

*Primary Examiner*—Que T Le
*Assistant Examiner*—Pascal M Bui-Pho
(74) *Attorney, Agent, or Firm*—Sughrue Mion, PLLC

(57) ABSTRACT

This solid-state imaging device comprises a rib integrally formed with a bottom plate. A case for accommodating a solid-state imaging device, which can suppress warping from occurring at the time of molding the case and is less deformable by heat at the time of mounting is provided. The solid-state imaging apparatus is less likely to cause readout errors and the like even when the temperature for use varies, and is highly reliable in operation.

12 Claims, 9 Drawing Sheets

CASE FOR ACCOMMODATING SOLID-STATE IMAGING DEVICE AND SOLID-STATE IMAGING APPARATUS

BACKGROUND OF THE INVENTION

1. Field of the Invention

The present invention relates to a case for accommodating a solid-state imaging device, and a solid-state imaging apparatus comprising the same.

2. Related Background Art

Though hollow cases made of ceramics have conventionally been used for solid-state imaging apparatus for a long time, hollow cases made of resins have recently been under development in order to cut their material cost down.

In the ceramic cases, the thermal expansion of the ceramics is on a par with that of lead frames or solid-state imaging device made of a metal or the like and that of a transparent plate or the like made of glass or the like. Therefore, deformations such as distortion and warping by heating and the like at the time of forming the case or mounting the solid-state imaging device are so small that they are not problematic in particular. In a case made of a resin, however, the difference in thermal expansion between the resin and a metal, glass, or the like is so large that the case is usually deformed greatly by heat at the time of molding or mounting. Such a deformation may shift the focal point of incident light, which is problematic in that the solid-state imaging device fails to read images accurately and so forth.

For example, a hollow case made of a resin in which the volume ratio between a case part located higher than a lead frame and a case part located lower than the lead frame is set in order to prevent the case from deforming at the time of mounting has been proposed (see Patent Document 1). The document proposes to suppress the warping at the time of integral molding by setting the volume ratio between the upper and lower parts of the case such that the case upper part volume/case lower part volume=1:1.6 to 1:1.8.

In cases formed from a resin by injection molding and the like, however, the resin is likely to have an anisotropy in coefficient of thermal expansion, whereby the coefficient of thermal expansion may differ between the bottom plate and side wall part of the case depending on how the resin flows into the case at the time of molding, which causes the warping when heating/cooling the case. Therefore, the warping of the case is hard to suppress by simply regulating the volume ratio between the upper and lower parts of the case as in Patent Document 1 (Japanese Patent Application Laid-Open No. HEI 11-330285), thus making it necessary to regulate dimensions of the bottom plate and side wall part of the case in order to control how the resin flows into the case at the time of molding.

SUMMARY OF THE INVENTION

It is one object of the present invention to provide a case for accommodating a solid-state imaging device, which can suppress warping from occurring at the time of molding the case and is less deformable by heat at the time of mounting. Another object of the present invention is to provide a solid-state imaging apparatus which is less likely to cause readout errors and the like even when the temperature for use varies, and is highly reliable in operation.

The case for accommodating a solid-state imaging device according to our invention is a hollow case made of a resin and integrally formed by a substantially rectangular bottom plate made of a resin, and a side wall made of a resin, provided substantially perpendicular to the bottom plate, having an outer shape area substantially the same as that of the bottom plate; the case having a lead terminal made of a metal inserted therein and an opening closable with a transparent plate; wherein at least one rib is vertically provided in a longitudinal direction of an outer bottom face of the bottom plate; and a solid-state imaging apparatus using this case. Note that the solid-state imaging device is arranged in the case for accommodating a solid-state imaging device to form a solid-state imaging apparatus.

In the present invention, the rib provided in the longitudinal direction of the outer bottom face of the bottom plate suppresses the influence due to the thermal expansion/shrinkage of the case caused by changes in temperature at the time of molding and mounting. The solid-state imaging apparatus of the present invention using this case is less likely to cause readout errors and the like, and can suppress malfunctions due to fluctuations in temperature for use.

Further the case for accommodating a solid-state imaging device in accordance with the present invention comprises a case body made of a resin having a depression for accommodation to dispose a solid-state imaging device in the inside thereof and a longitudinal direction size of which is 3 or more times the width direction size, a plurality of lead terminals which are elongated from the inside of the depression for accommodation to the outside through a side wall running parallel to a longitudinal direction of the case body, and a rib made of a resin which is integrally formed by a bottom plate along a longitudinal direction of the bottom plate of the case body.

Even though the case body has a high aspect ratio apt to cause distortion and is made of a resin, due to provision of the rib elongating in a longitudinal direction, warping and flexure in the perpendicular direction to the longitudinal direction of the case body can be suppressed. It is preferable that the number of the ribs be plural, and from a viewpoint of increasing rigidity, the rib is preferably positioned at an extension of a height direction of the side wall. The lead terminal is electrically connected to the solid-state imaging device.

Also, the case for accommodating a solid-state imaging device in accordance with the present invention further comprises a reinforcing part which is integrally formed with the side wall and projecting outward from both ends of a longitudinal direction of the case body along the longitudinal direction. The reinforcing part can suppress warping and flexure in the perpendicular direction of the side wall.

The case body and the rib are preferably made of a resin comprising a liquid crystal polymer. When using the liquid crystal polymer as a material for the case body having a high aspect ratio, a high molecular orientation aligned in the longitudinal direction can be obtained, and thus the case becomes excellent in heat resistance, strength properties, and low thermal expansion property.

Further, preferably, a filler comprising an inorganic material is contained in the resin. Namely, by containing the filler comprising an inorganic material in the resin, rigidity can be further enhanced. By the combination of the liquid crystal polymer and the inorganic material filler, a case having a synergistically high rigidity can be structured.

The filler preferably comprises a plurality of fibrous bodies or needle-like bodies, and each of the fibrous bodies or needle-like bodies has an aspect ratio of not less than 5. Namely, when an aspect ratio is not less than 5, a case rigidity can be enhanced sufficiently.

Preferably, in the side wall of the case body, the width direction is assumed to be a depth direction, and the side wall has a plurality of depression (thinned part) elongating along the longitudinal direction. Due to this, a flow of the resin at the time of resin molding can be homogenized, and a lighter weight can be attained.

Also, a total of the lengths of the plural depressions in the longitudinal direction is characterized in being from 20% to 90% of the length of the case body in the longitudinal direction. In this case also, the case body can sufficiently maintain its rigidity.

A total height b of the case body and the rib and a width a of the case body preferably satisfy the following equation:

$1 \leq a/b \leq 2.5.$

A thickness h of the bottom plate of the case body, a width c of the rib, and an each depth i of the plural depressions preferably satisfy the following equation:

$0.1 \leq i/(c+h) \leq 0.4.$

A thickness h of the bottom plate of the case body, and a each width g of the plural depressions along the height direction of the case body preferably satisfy the following equation:

$0.7 \leq g/h \leq 1.5.$

A width c of the rib and a height d of the rib preferably satisfy the following equation:

$0.5 \leq d/c \leq 2.0.$

In addition, a solid-state imaging apparatus comprises the aforementioned case for accommodating a solid-state imaging device, the solid-state imaging device provided within the depression for accommodation, and a transparent plate to close an opening of the depression for accommodation. In the case having a high aspect ratio, a solid-state imaging device having a high aspect ratio can be disposed. Such a solid-state imaging device can be used as an one-dimensional CCD (line sensor).

DESCRIPTION OF THE PREFERRED EMBODIMENT

In the following, the present invention and its embodiments will be explained with reference to the drawings.

Figure 1:
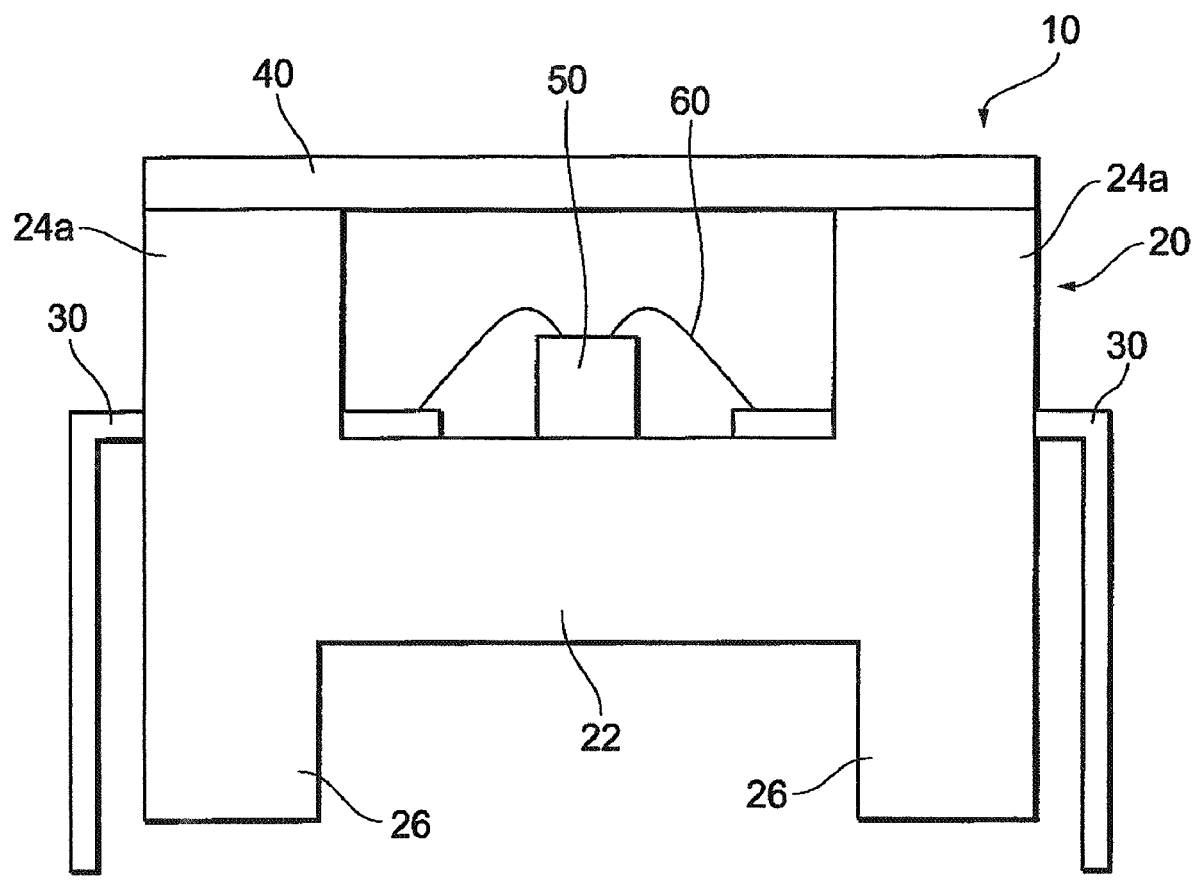
FIG. 1 is a schematic sectional view showing an example of the solid-state imaging apparatus in accordance with the present invention transversely cut at a longitudinal center part of the apparatus.
Figure 2:
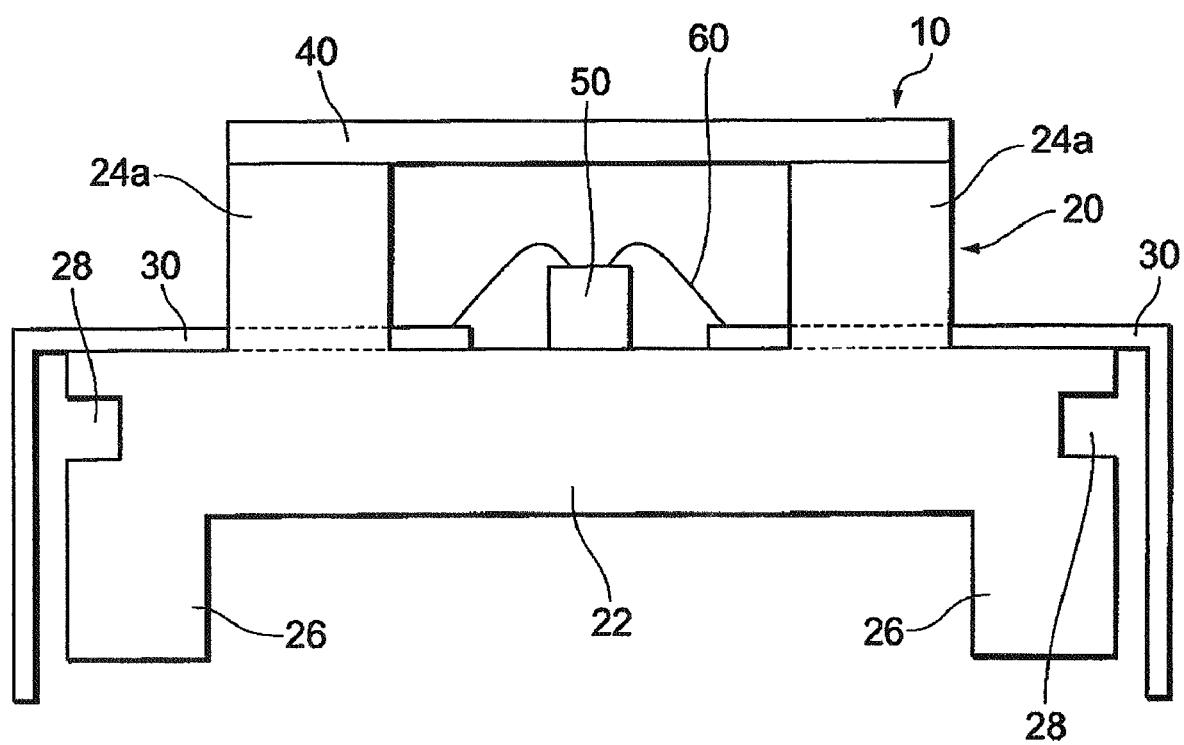
FIG. 2 is a schematic sectional view showing another example of the solid-state imaging apparatus in accordance with the present invention transversely cut at a longitudinal center part of the apparatus.

FIG. 1 is a schematic sectional view showing an example of the solid-state imaging apparatus in accordance with the present invention transversely cut at a longitudinal center part of the apparatus. FIG. 2 is a schematic sectional view showing another example of the solid-state imaging apparatus in accordance with the present invention transversely cut at a longitudinal center part of the apparatus.

As shown in FIGS. 1 and 2, the solid-state imaging apparatus 10 in accordance with the present invention comprises a case 20 for accommodating a solid-state imaging device, lead terminals 30, a transparent plate 40, and a solid-state imaging device 50, and preferably further comprises means for electrically taking recording information out of the case, such as bonding wires 60.

The case 20 for accommodating a solid-state imaging device in accordance with the present invention is a hollow case made of a resin and integrally formed by a substantially rectangular bottom plate 22 made of a resin, and a side wall 24, provided substantially perpendicular to the bottom plate, having an outer shape area substantially the same as that of the bottom plate 22; the case having the lead terminals 30 made of a metal inserted therein and an opening closable with a transparent plate 40; whereas at least one rib 26 is vertically provided in a longitudinal direction of the outer bottom face of the bottom plate 22.

The solid-state imaging apparatus 10 in accordance with the present invention comprises the case 20 having the lead terminals 30 made of a metal inserted therein, whereas the opening of the case 20 is closed with the transparent plate 40, so that the solid-state imaging device 50 can capture an image incident thereon from the outside of the apparatus through the transparent plate 40. The solid-state imaging device 50 is placed on the inner bottom face of the case and has outer leads for connecting its device circuit to the outside of the apparatus. The inner bottom face of the case has an area for mounting the solid-state imaging device 50. The solid-state imaging device 50 and the lead terminals 30 formed from a conductive metal are preferably electrically connected to each other by the bonding wires 60, whereas the lead terminals 30 electrically connect the solid-state imaging apparatus to the outside. Not only the lead terminals but means electrically connectable to the outside such as metal bumps may also be used. The lead terminal 30 is preferably made of copper.

The bottom plate is made of a resin having a substantially rectangular form with inner and outer bottom faces. "Substantially rectangular" refers to not only square and completely rectangular forms but also nearly rectangular forms. "Nearly rectangular" is meant to encompass forms having parallel longer sides with linear shorter sides not orthogonal to the longer sides or nonlinear shorter sides, and very long ellipses. Forms lacking the four corners in rectangles, forms with rounded corners in rectangles, and forms with semicircular shorter sides instead of lines are also included in the above-mentioned "nearly rectangular" forms of the bottom face of the case having parallel longer sides.

The inner bottom face refers to the surface on the side provided with the side wall, whereas the outer bottom face refers to the surface opposite from the surface provided with the side wall.

The side wall constituting the case is made of a resin, while having an outer shape area substantially the same as that of the bottom plate and being provided substantially perpendicular to the bottom plate. The side wall is provided on the bottom plate so as to correspond to four sides of the bottom plate, and constructs a frame. The "outer shape area" refers to an area surrounded by the outer periphery of the side wall. "Having an outer shape area substantially the same as that of the bottom plate" is meant to encompass the bottom plate area completely the same as the outer shape area of the side wall or 1.0 to 2.5 times that of the latter, and is preferably 1.0 to 1.5 times that of the latter. Specifically, the side wall has a form constituting four side walls of a rectangular parallelepiped, whereas the outer peripheral area of the frame connected to the bottom plate is the same as that of the bottom plate (FIG. 1) or smaller than the latter (FIG. 2).

Though provided substantially perpendicular to the substantially rectangular bottom plate, the side wall is meant to include not only the side wall provided perpendicularly in a strict sense, but also side walls made of resins provided in a somewhat widening fashion toward the opening. "Somewhat widening" is meant to include an inclination within 45°, preferably 35°, from a vertical direction.

The lead terminals connect the solid-state imaging apparatus to external circuits electrically and mechanically. The lead terminals also act to partly radiate the heat generated by the solid-state imaging device to the outside of the case by thermal conduction. Known lead terminals made of a metal can be used. Examples of the metal include copper, copper alloys, and iron alloys, which may be plated with gold, silver, nickel, solder, or the like. Among them, copper plated with gold and Alloy 42, which is an alloy made of 58% of iron and 42% of nickel, can be used favorably.

Preferably, the lead terminals are integrally formed with a resin composition while using a lead frame at the time of molding the case and then is subjected to processing such as bending and cutting.

The number of lead terminals and positions where they are inserted in the case are not restricted in particular as long as they do not deviate from the gist of the present invention.

The opening in the upper part of the case for accommodating a solid-state imaging device can be closed with a transparent plate. After the installation and wiring of the solid-state imaging device is completed, the case for accommodating a solid-state imaging device is closed with the transparent plate.

The transparent plate refers to a planar member exhibiting a transmittance of at least 80%, preferably at least 90%, with respect to incident light used for imaging, which is generally in visible (400 to 700 nm) and near-infrared regions. Preferably, the transparent plate 40 exhibits a transmittance of 90% or higher at a wavelength of 400 to 800 nm. When the solid-state imaging apparatus is used as a barcode reader in particular, it will be preferred if the transparent plate exhibits a transmittance of 90% or higher at a wavelength of 650 to 660 nm.

Though the material for the transparent plate is not restricted in particular as long as the gist of the present invention is satisfied, its preferred examples include transparent glass, transparent resins, and light-transmitting ceramics. More specific examples of the material for the transparent plate include glass, acrylic resin, polycarbonate, and cycloolefin-unit-containing polymers. Lenses and the like may also be used for the transparent plate in order to yield a light-converging effect.

Examples of methods for joining the transparent plate and the case for accommodating a solid-state imaging device together include bonding with an adhesive or the like and fitting. While known adhesives can be used, preferred are known thermosetting resins, moisture-curing resins, visible-light-curing resins, and UV-curing resins, examples of which include epoxy resin, unsaturated polyester resin, phenol resin, urea/melamine resin, polyurethane resin, silicone resin, polyimide resin, and acrylate resin. For resin-forming compositions forming these curable resins, additives such as polymerization initiator, crosslinking agent, and reaction accelerator and inorganic fillers such as silica may appropriately be combined, in conformity to their uses, with monomers, oligomers, and polymers forming the curable resins if necessary.

The case for accommodating a solid-state imaging device in accordance with the present invention has at least one rib vertically provided in a longitudinal direction of the outer bottom face of the resin bottom plate.

The "rib" refers to a part reinforcing the mechanical strength of the resin case.

The "longitudinal direction" refers to a direction along which the longer sides of the rectangle extend, whereas the "transverse direction" refers to a direction along which the shorter sides of the rectangle extend.

"Vertically provided in a longitudinal direction of the outer bottom face" encompasses anything as long as it is substantially parallel to the longitudinal direction of the outer bottom face while being substantially vertical to the outer bottom face, whereas the rib may have an oblong, trapezoidal, or triangular cross section as well.

Because of the rib, the case for accommodating a solid-state imaging device in accordance with the present invention not only increases its mechanical strength, but also can suppress the distortion and warping occurring at the time of molding and mounting along with the thermal expansion/shrinkage upon heating/cooling.

Also, because of the rib, the case for accommodating a solid-state imaging device in accordance with the present invention widens its radiating surface area, so that the heat generated by the solid-state imaging device can radiate from its rib surface when the case is used as a solid-state imaging apparatus, whereby a heat-radiating effect superior to that in a ribless case for accommodating a solid-state imaging device is obtained. A better heat-radiating effect is obtained when the solid-state imaging apparatus of the present invention and a known blower are combined together so as to send a wind in a transverse direction of the solid-state imaging apparatus.

The number of ribs provided is not restricted in particular as long as it does not deviate from the gist of the present invention, but is preferably 2 for the purpose of more effectively suppressing the warping of the case made of a resin. When the number of ribs is 2, the warping suppressing effect is sufficient, there is no fear of the case tilting at the time of mounting onto a substrate or the like, and die bonding, wire bonding, and the like will not be obstructed at the time of assembling the solid-state imaging apparatus. Preferably, the ribs are vertically provided in the longitudinal direction of the bottom face of the resin bottom plate at both transverse end parts. When a plurality of ribs are provided, it will be preferred if they have respective cross-sectional forms congruent to each other.

If necessary, the ribs may be provided with a thinned part which will be explained later, a through hole part in which a hole penetrates through the rib, and the like.

As a specific example of the ribs, it will be preferred if respective ribs 26 are vertically provided at both end parts of the outer bottom face so as to oppose longitudinal side walls 24a of the case, so that the case has an H-shaped cross section at its longitudinal center part as shown in FIG. 1.

Figure 3:
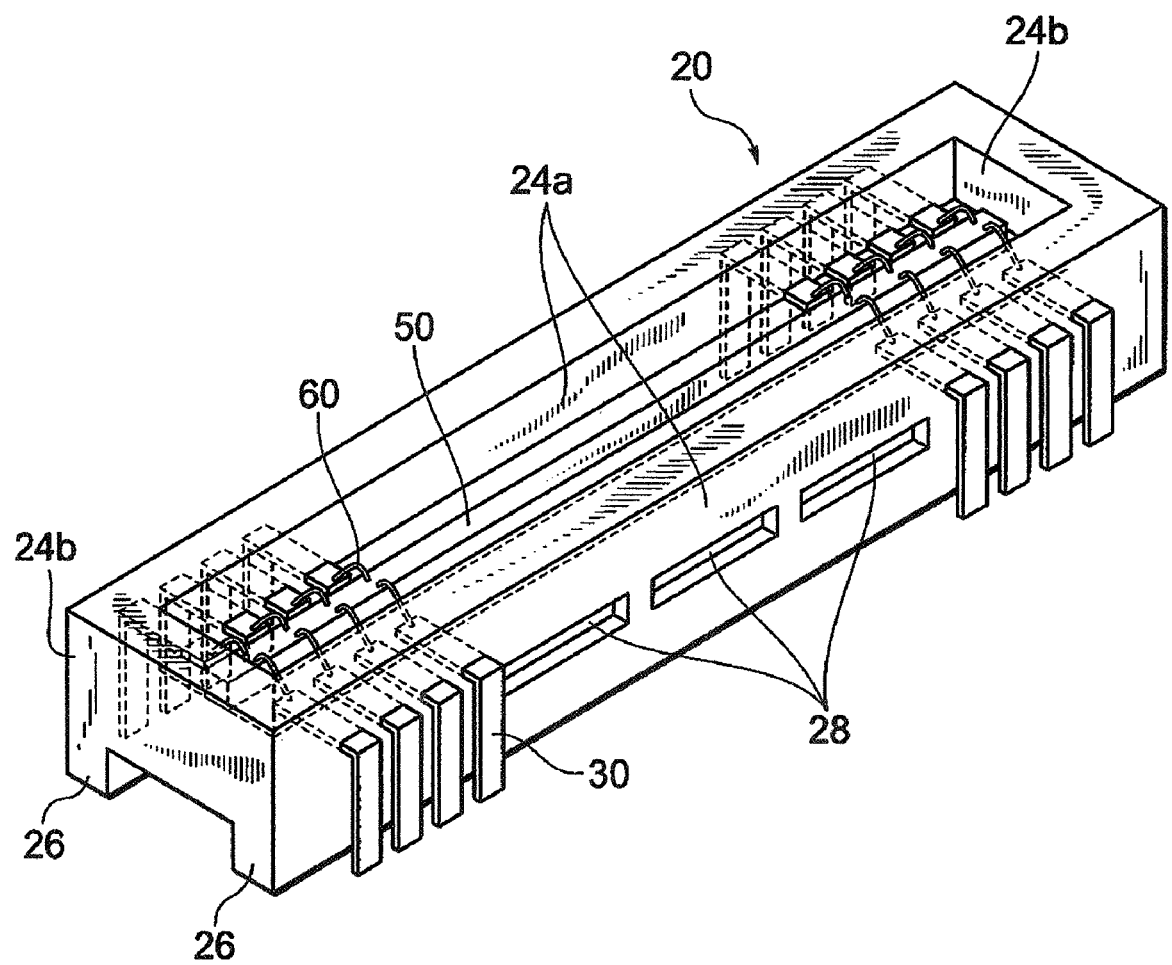
FIG. 3 is a perspective view showing an example of the case for accommodating a solid-state imaging device in accordance with the present invention having lead terminals inserted therein while being mounted with a solid-state imaging device and bonding wires and provided with thinned parts.

As shown in FIG. 3, the "longitudinal side walls" refer to side walls 24a which are substantially parallel to the longer sides of the bottom plate and project substantially vertically from the bottom plate, while "transverse side walls" refer to side walls 24b which are substantially parallel to the shorter sides of the bottom plate and project substantially vertically from the bottom plate.

The "cross section at the longitudinal center part of the case" refers to a cross section of an inner part of the case excluding the outside of the transverse side wall parts in the longitudinal direction of the case.

The case for accommodating a solid-state imaging device having the form shown in FIG. 1 is superior in terms of the suppression of thermal deformation, workability at the time of assembling the solid-state imaging apparatus, heat-radiating effect, and cost. While it is usually necessary to heat the solid-state imaging device and lead terminals when carrying out wire bonding, a heating block such as heater can be brought into contact with the outer bottom face for efficient heating when the case has the form shown in FIG. 1.

As shown in FIG. 2 as a sectional view, the two ribs 26 opposing each other can be provided with a wider space therebetween than are the two longitudinal side walls 24a.

The case for accommodating a solid-state imaging device in accordance with the present invention is obtained by molding a synthetic resin alone or a resin composition including various fillers in addition to a resin. Examples of the method of molding the case include injection molding, injection compression molding, compression molding, and transfer molding. Among them, the injection molding is used preferably. When the injection molding is used, it will be preferred if a gate at the time of injection molding is provided within the surface of one of the transverse side walls or the end of the backside of the case.

When the gate is provided within the surface of one of the transverse side walls of the case, the resin flows with a favorable balance in a direction parallel to the longitudinal side walls and the ribs provided parallel to the longitudinal direction, whereby individual parts of the side walls, bottom plate, and rib in the molded case have a uniform coefficient of linear expansion, which can suppress warping from occurring along with the thermal deformation upon heating/cooling.

Preferably, the case for accommodating a solid-state imaging device in accordance with the present invention has a longitudinal size which is more than 3 times, more preferably 4 to 20 times, more preferably 4 to 15 times, the transverse size thereof.

Examples of the resin employed include moldable thermosetting and thermoplastic resins, which are preferably selected from the viewpoints of flame resistance, electric insulation, and strength/rigidity. From the viewpoint of being able to shorten the molding cycle and cutting the molding cost down, it will be preferred if a thermoplastic resin or a resin composition including various fillers in addition to a thermoplastic resin is integrally injection-molded, so as to form the case for accommodating a solid-state imaging device.

Examples of the thermosetting resin include phenol resin, urea resin, melamine resin, diallyl phthalate resin, epoxy resin, polyurethane resin, polyimide resin, and unsaturated polyester resin, among which phenol resin and epoxy resin are preferably used.

Examples of the thermoplastic resin include polystyrene resin, acrylic resin, polycarbonate resin, polyester resin, polyamide resin, polyacetal resin, polyphenylene ether resin, fluorine resin, polyphenylene sulfide resin, polysulfone resin, polyarylate resin, polyether imide resin, polyether sulfone resin, polyether ketone resin, liquid-crystal polymer, polya-mide-imide resin, and polyimide resin, among which polyester resin, polyamide resin, polyphenylene sulfide resin, and liquid-crystal polymer are preferably used, and liquid-crystal polymer can be used preferably in particular from the viewpoint of its superior flowability, heat resistance, and rigidity. These resins may be used either singly or as a polymer alloy employing a plurality of them at the same time.

The case body and the rib connected to the case body are both preferably made of a liquid crystal polymer.

Overviews of the above-mentioned resins are described in "Concise Encyclopedia of Polymer Science and Engineering" (published by Maruzen Co., Ltd. on Sep. 20, 1994), literatures cited therein, and the like.

The resin forming the case for accommodating a solid-state imaging device can be filled with various fillers in order to improve the strength, rigidity, heat resistance, and accuracy in dimensional precision, lower the coefficient of linear expansion, and so forth.

Examples of the fillers for use include inorganic fillers such as glass fibers (milled glass fiber, chopped glass fiber, etc.), glass beads, hollow glass balls, glass powder, mica, talc, clay, silica, alumina, potassium titanate, wollastonite, calcium carbonate, magnesium carbonate, sodium sulfate, calcium sulfate, barium sulfate, calcium sulfite, aluminum hydroxide, magnesium hydroxide, calcium hydroxide, calcium silicate, silica sand, silica rock, silica, titanium oxide, zinc oxide, iron oxide, graphite, molybdenum, asbestos, silica alumina fiber, alumina fiber, gypsum fiber, carbon fiber, carbon black, white carbon, diatomaceous earth, bentonite, sericite, shirasu, and black lead; and metal and nonmetal whiskers such as potassium titanate whisker, alumina whisker, aluminum borate whisker, silicon carbide whisker, and silicon nitride whisker. Among them, carbon black, which yields a light-shielding effect, a diffused light reflection preventing effect within the case, etc. is preferably used.

When the case for accommodating a solid-state imaging device is obtained by injection molding, it will be preferred if its injection-molding gate is provided on one of the transverse side walls of the case, while a thinned part is provided in a longitudinal side wall part of the case.

Figure 4:
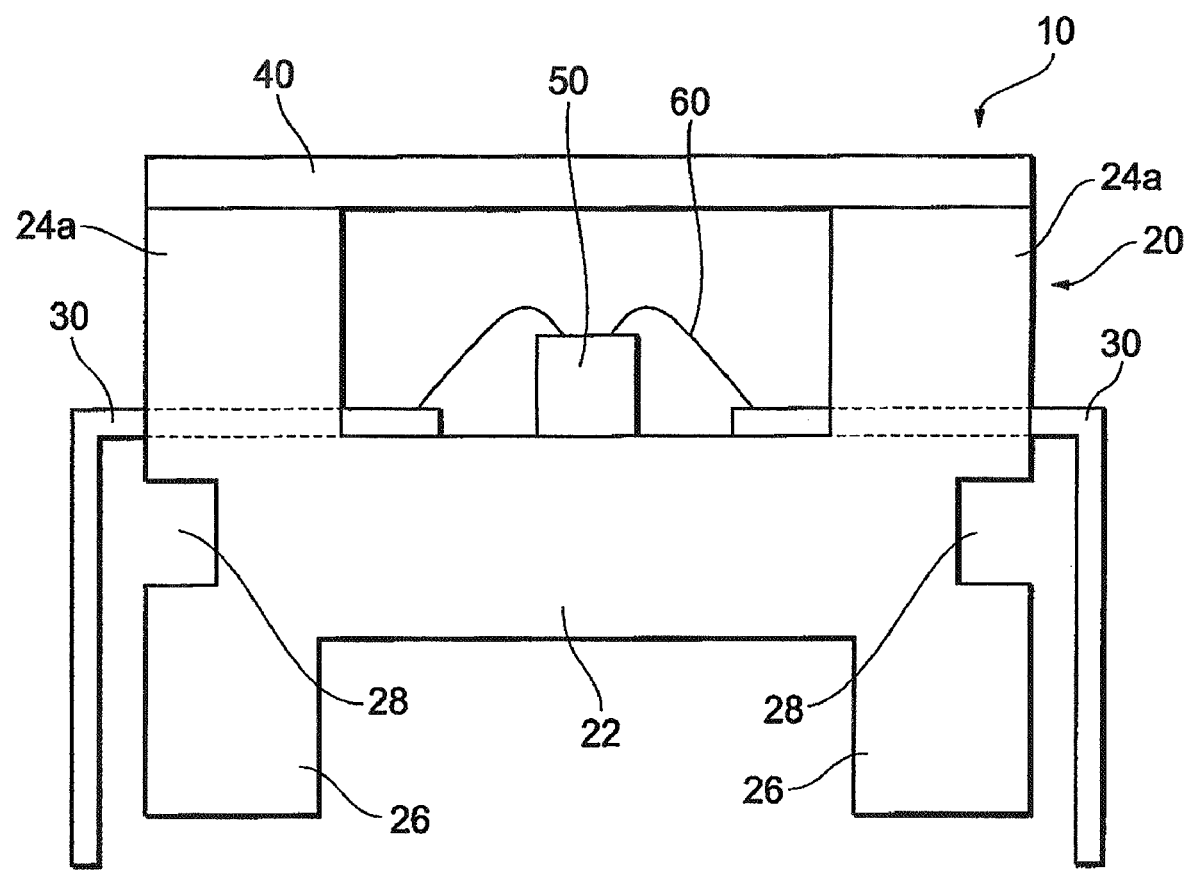
FIG. 4 is a schematic sectional view showing an example of the solid-state imaging apparatus of the present invention provided with the thinned parts as transversely cut at the thinned parts.

FIG. 3 is a perspective view showing an example of the case for accommodating a solid-state imaging device having lead terminals inserted therein while being mounted with a solid-state imaging device and bonding wires and provided with thinned parts, whereas FIG. 4 is a schematic sectional view showing an example of the solid-state imaging apparatus of the present invention provided with the thinned parts as transversely cut at the thinned parts.

As shown in FIGS. 3 and 4, longitudinal side wall parts of the case are provided with several thinned parts 28. The side wall parts refer to parts facing the outside of the case in the longitudinal direction, which encompass a part of the side walls, bottom plate, and ribs.

The thinned parts 28 refer to portions of the side wall parts and the like of the case excluding unnecessary parts in order to attain a lighter weight and homogenize the flow of the resin into the case at the time of injection molding while leaving necessary parts such that the case 20 for accommodating a solid-state imaging device attains a sufficient strength. The positions, forms, sizes, and number of thinned parts 28 are not restricted in particular as long as the side wall parts of the case 20 for accommodating a solid-state imaging device attain a sufficient strength.

It will be preferred if the thinned parts 28 are provided at several locations in thick regions where the side wall parts of the case 20 for accommodating a solid-state imaging device are connected to the bottom plate part as shown in FIGS. 3 and 4. Providing the thinned parts as mentioned above allows the side walls, bottom plate, and ribs of the case to make the resin flow uniformly when injection-molding the case with a die having a gate provided on one of the transverse side walls, and thus can further suppress the case from warping.

The solid-state imaging device comprises an array of pixels generating signal electric charges in response to incident light, and a reading part functioning to sequentially read out the signal electric charges of the pixel array. The solid-state imaging device is preferably a semiconductor imaging device having a number of pixel arrays, and is roughly divided into one-dimensional image sensors (linear sensors) each made of one-dimensional pixel arrays and two-dimensional image array sensors (area sensors) made of two-dimensional pixel arrays. While the solid-state imaging apparatus used in the present invention may employ any of the linear and area sensors as the solid-state imaging device, the linear sensors can be used preferably. Examples of the imaging device include CCD image sensors, CMOS image sensors, CMD, charge injection devices, and infrared image sensors. The length of the linear sensor is typically 2 to 15 cm, preferably 3 to 10 cm.

The solid-state imaging apparatus of the present invention can be used in facsimile machines, scanners, barcode readers, and TV cameras, for example.

The bonding wires are leads electrically connecting the solid-state imaging device to the lead terminals.

The boding wires are thin metal lines, which are preferably made of gold, aluminum, copper, or an alloy mainly composed of these metals. Though depending on the material of leads and the like, examples of the method of connecting the bonding wires include ball bonding and wedge bonding.

For preventing the difference in thermal expansion between the solid-state imaging device and resin case from causing distortions, the solid-state imaging apparatus of the present invention may include an undepicted island disposed on the inner bottom face of the case. The island is formed in an inner bottom part of the case for accommodating a solid-state imaging device, whereas the solid-state imaging device is firmly attached onto the island. The island is made of a metal, examples of which include copper, copper alloys, aluminum, aluminum alloys, and iron alloys. Among them, copper, aluminum alloys, gold-plated copper, and Alloy 42 are preferably used.

The solid-state imaging device is firmly attached to the island preferably by an adhesive, soldering, or the like, more preferably by an adhesive. Though known adhesives can be used, insulating adhesives with a high coefficient of thermal conductivity are preferred, those having a coefficient of thermal conductivity of at least 1 W/mK are more preferred, and those having a coefficient of thermal conductivity of at least 3 W/mK are preferred in particular.

The island may have a protrusion projecting perpendicular to the longitudinal direction, whereas the protrusion may partly be embedded in the case, so as to form a fixed island-holding part.

As mentioned above, as the resin for forming the case for accommodating a solid-sate imaging device, from the aims of improvement of strength, rigidity, heat resistance, improvement of dimensional accuracy, and lowering of linear expansion coefficient, it is preferable to add an inorganic fibrous filler and/or inorganic needle-like filler to the resin.

Examples of the inorganic fibrous filler and inorganic needle-like filler include, carbon fiber, silicon carbide fiber, alumina fiber, boron fiber, silicon carbide whisker, silicon nitride whisker, potassium titanate whisker, calcium titanate whisker, aluminum borate whisker, zinc oxide whisker, and the like. These may be used either singly or employing a plurality of them at the same time.

An aspect ratio of the inorganic fibrous filler and inorganic needle-like filler used in the present invention is preferably not less than 5, more preferably not less than 10. In other words, the filler comprises a fibrous body or needle-like body, and each fibrous body or needle-like body has an aspect ratio of not less than 5. When using the inorganic filler having such a high aspect ratio, the case for accommodating a solid-state imaging device being excellent in dynamic properties and dimensional accuracy and having a low linear expansion coefficient can be obtained.

Among these inorganic fibrous filler and inorganic needle-like filler, for improving a dimensional accuracy and surface flatness of the case for accommodating a solid-state imaging device, it is preferable to use an inorganic needle-like filler with an average diameter of fiber of from 0.1 to 5 μm. Further in view of being obtainable at a relatively low cost, it is more preferable to use at least one or combination of potassium titanate whisker, aluminum borate whisker, and zinc oxide whisker.

When filling the resin with the inorganic fibrous filler and/or inorganic needle-like filler, a mixing amount thereof is to 100 parts by weight of the liquid crystal polymer, from 20 to 150 parts by weight, preferably from 30 to 120 parts by weight, more preferably from 40 to 100 parts by weight. When a content of the inorganic fibrous filler and/or inorganic needle-like filler is small, there are tendencies that dimensional accuracy of the resulting case for accommodating a solid-state imaging device is lowered, that warping and linear expansion coefficient becomes large, and that strength and rigidity are not enough. When the content is large, there are tendencies that flowability of the resin composition is lowered and that strength of the case for accommodating a solid-state imaging device is lowered.

In order to improve the strength, rigidity and heat resistance, improvement of dimensional accuracy, lowering of linear expansion coefficient, and the like, it is preferable to fill the inorganic plate-like filler to the resin used in the present invention. Examples of the plate-like filler include talc, mica, glass flake, montmorillionite, smectite, graphite, boron nitride, molybdenum disulfide and the like. These may be used either singly or employing a plurality of them at the same time. In order to improve the thermal conductivity of the resin composition, it is preferable to use the inorganic filler having a thermal conductivity of not less than 1 W/mK. Examples of the inorganic filler having a thermal conductivity of not less than 1 W/mK include talc, graphite, boron nitride, and the like. Among them, in view of cost and electrical insulation, talc is most preferably used.

When filling the resin with the inorganic plate-like filler, a mixing amount thereof is to 100 parts by weight of the liquid crystal polymer, from 10 to 100 parts by weight, preferably from 10 to 80 parts by weight. When a content of the inorganic plate-like filler is small, there are tendencies that dimensional accuracy of the resulting case for accommodating a solid-state imaging device is lowered and that warping becomes large, and when the content is large, there are tendencies that flowability of the resin composition is lowered and that strength of the resulting case for accommodating a solid-state imaging device is lowered.

From the aims of improvement of strength, rigidity, and heat resistance, improvement of dimensional accuracy, and lowering of linear expansion coefficient, it is preferable to fill the resin to be used in the present invention with a glass fiber.

The glass fiber may be surface-treated with a surface treating agent such as a silane coupling agent or may not be surface-treated.

When filling the resin with the glass fiber, a mixing amount thereof is to 100 parts by weight of the liquid crystal polymer, from 5 to 50 parts by weight, preferably from 10 to 40 parts by weight. When filling with the glass fiber, the heat resistance of the case for accommodating a solid-state imaging device can be improved, the warping and deformation due to heating can be suppressed, and also the weld strength can be improved. When a content of the glass fiber is too large, however, it is not preferable because there is a tendency to lower the flowability of the resin composition. When the content is small, effects of improving the heat resistance and weld strength of the case for accommodating a solid-state imaging device cannot be obtained.

In order to obtain a light-shielding effect and to prevent light from diffused reflection in the case, it is preferable to add an inorganic or organic dye, pigment, or coloring agent to the resin to be used in the present invention, in view of availability, addition of carbon black is more preferable.

Figure 5:
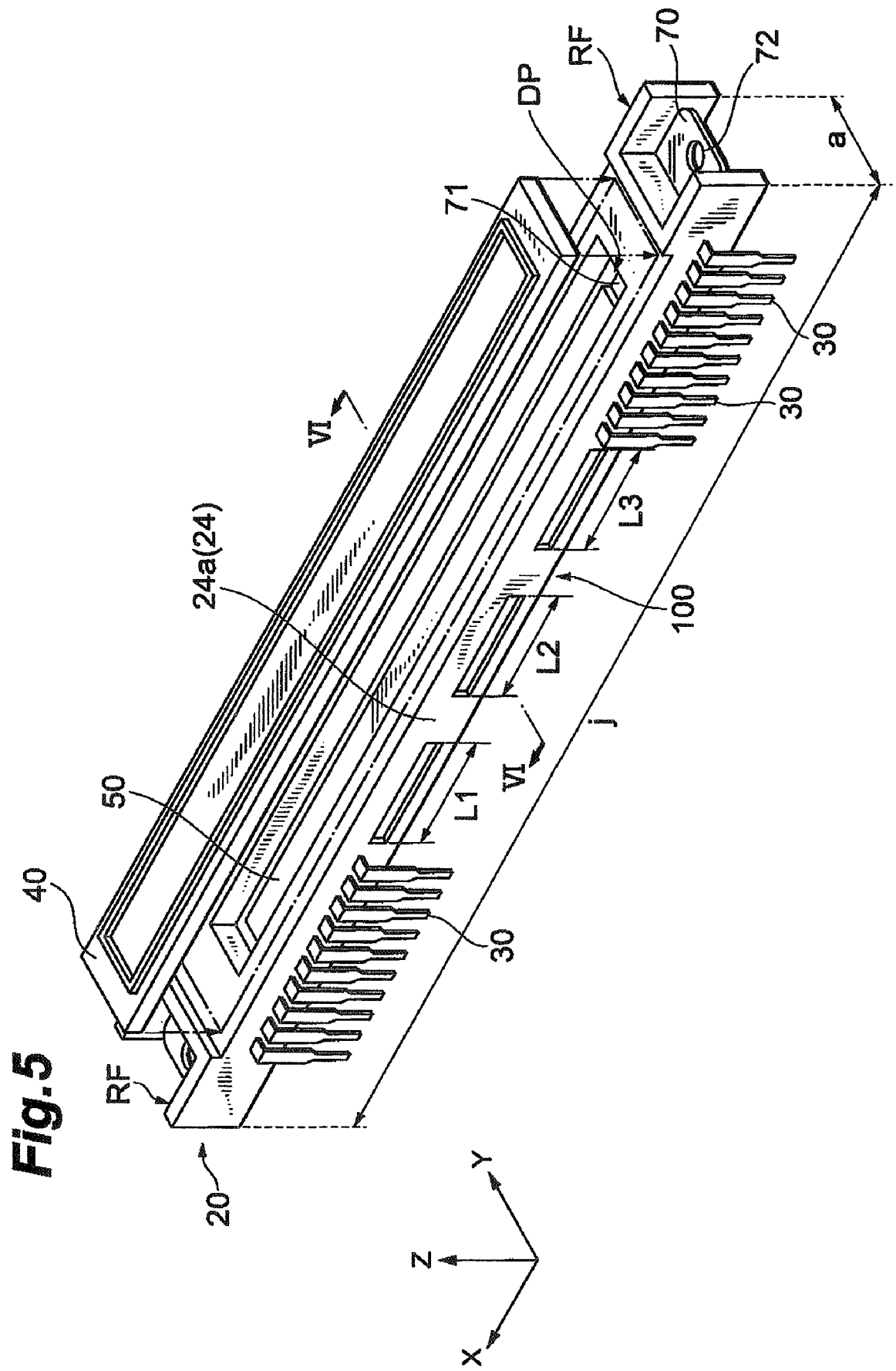
FIG. 5 is an exploded perspective view of the solid-state imaging apparatus.
Figure 6:
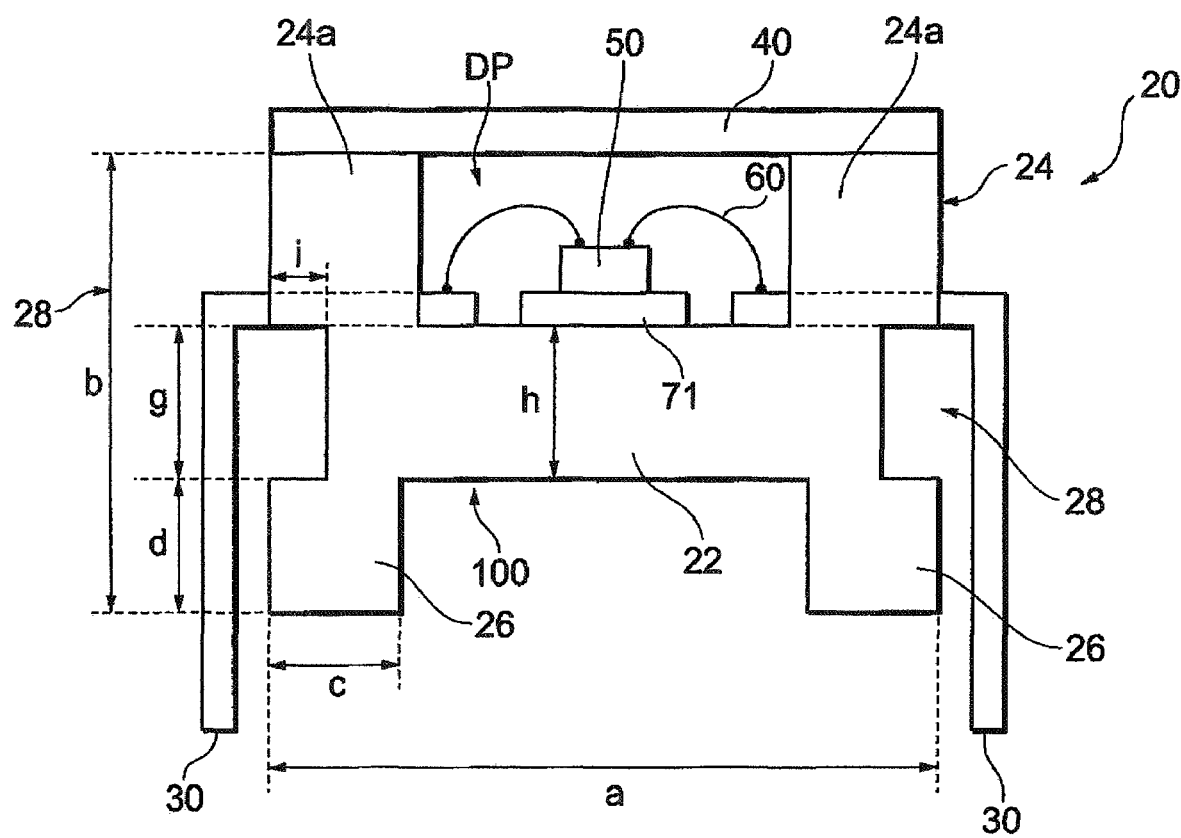
FIG. 6 is a sectional view of VI-VI arrow section of the solid-state imaging apparatus shown in FIG. 5.

FIG. 5 is an exploded perspective view of the solid-state imaging apparatus, and FIG. 6 is a sectional view of VI-VI-arrow section of the solid-state imaging apparatus shown in FIG. 5.

As mentioned above, a case 20 for accommodating a solid-state imaging device comprises a case body 100 made of a resin having a depression DP for accommodation to dispose a solid-state imaging device 50 in the inside thereof and a longitudinal size j in the longitudinal direction X which is 3 or more times the size a in the width direction Y, a plurality of lead terminals 30 which are elongated from the inside of the depression DP for accommodation to the outside through a side wall 24a running parallel to a longitudinal direction X of the case body 100, and a rib 26 made of a resin which is integrally formed with a bottom plate 22 along the longitudinal direction X of the bottom plate 22 of the case body 100.

The solid-state imaging apparatus comprises the case 20 for accommodating a solid-state imaging device, the solid-state imaging device 50 disposed within the depression DP for accommodation, and the transparent plate 40 for closing an opening of the depression DP for accommodation.

The case has a high aspect ratio, and thus a solid-state imaging device 50 having a high aspect ratio is disposed. This solid-state imaging device 50 is an one-dimensional CCD (line sensor). Even though the case body 100 has a high aspect ratio apt to cause distortion and is made of a resin, in the apparatus, due to provision of the rib 26 elongating in a longitudinal direction X, warping and flexure in the perpendicular direction to the longitudinal direction X of the case body 100 can be suppressed.

It is preferable that the number of the ribs 26 be plural, and from an viewpoint of increasing rigidity, the rib is preferably positioned at an extension in a height direction Z of the side wall 24a. The lead terminal 30 is electrically connected to the solid-state imaging device 50 via a bonding wire 60.

At the both ends of a longitudinal direction of the case for accommodating a solid-state imaging device, reinforcing parts RF are provided respectively. The reinforcing part RF is integrally formed with the side wall 24a, and projects outward from both ends in a longitudinal direction of the case body 100 along the longitudinal direction X. The sectional surface of XY section of the reinforcing part RF forms substantially U-shape together with the both ends of the case body 100. The reinforcing part RF suppresses warping and flexure in the perpendicular direction of the side wall 24a. In an inside space of the reinforcing part RF, a part of a lead frame 70 is exposed, and the lead frame 70 is connected to a die pad 71 which is mounted on the solid-state imaging apparatus 50. An opening 72 is provided on the exposed lead frame 70, and it is also possible to fix the frame to another apparatus by inserting a pin or the like.

The case body 100, the rib 26 and the reinforcing part RF are made of a resin comprising a liquid crystal polymer. When using the liquid crystal polymer as a material for the case body having a high aspect ratio, a high molecular orientation aligned in the longitudinal direction can be obtained, and thus the case becomes excellent in heat resistance, strength properties, and low thermal expansion property.

Further, as mentioned above, preferably, a filler comprising an inorganic material is contained in the resin. Namely, by containing the filler comprising an inorganic material in the resin, rigidity can be further enhanced. By the combination of the liquid crystal polymer and the inorganic material filler, a case having a synergistically high rigidity can be structured. The filler comprises a plurality of fibrous bodies or needle-like bodies, and each of the fibrous bodies or needle-like bodies has an aspect ratio of not less than 5.

In the side wall 24a of the case body 100, the width direction Y is assumed to be a depth direction, and the side wall has a plurality of depressions (thinned parts) 28 elongating along the longitudinal direction X. Due to this, a flow of the resin at the time of resin molding can be homogenized, and a lighter weight can be attained.

A total $\Sigma$ of the lengths L1, L2, and L3 of these plural depressions 28 in the longitudinal direction X is from 20% to 90% of the length j of the case body 100 in the longitudinal direction X. The total $\Sigma$ is preferably from 30% to 80%. The total $\Sigma$ is more preferably from 40% to 70%. In these cases, the case body 100 can sufficiently maintain its rigidity.

A width a of the case body 100, a total height b of the case body 100 and the rib 26, a width c of the rib 26, a height d of the rib, a each width g of the plural depressions 28 along the height direction Z of the case body 100, a thickness h of the bottom plate 22 of the case body 100, and an each depth i of the plural depressions 28 preferably satisfy the following equations:

$$1 \leq a/b \leq 2.5,$$

$$0.1 \leq i/(c+h) \leq 0.4,$$

$$0.7 \leq g/h \leq 1.5,$$

$$0.5 \leq d/c \leq 2.0.$$

When satisfying these equations, the case body 100 can maintain its rigidity much higher.

Figure 7:
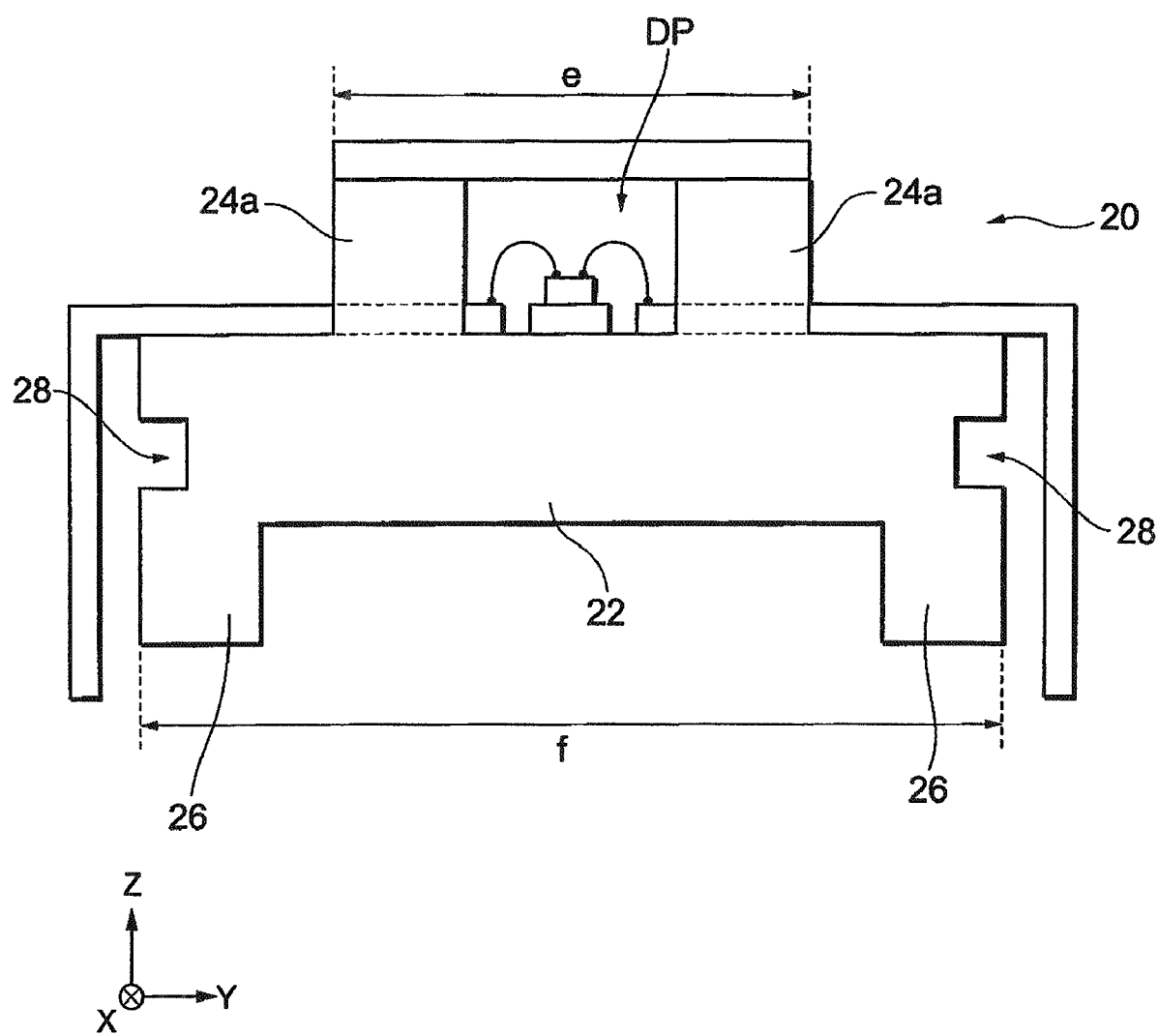
FIG. 7 is a longitudinal sectional view of the solid-state imaging apparatus shown in FIG. 2.

FIG. 7 is a longitudinal sectional view of the solid-state imaging apparatus shown in FIG. 2.

With respect to this case for accommodating a solid-state imaging device, the maximum separation e along the width direction Y of the side wall 24a which profiles the depression DP is different from the maximum separation f along the width direction Y of the bottom plate 22 and the rib 26, and thus the side wall 24 has a step in its height direction. In the instant embodiment, the maximum separation e is shorter than the maximum separation f. This structure preferably satisfies the following equation:

$$0.8 \leq f/e \leq 2.0.$$

When the step is formed and this equation is satisfied, the case body 100 can maintain its rigidity high.

Figure 8:
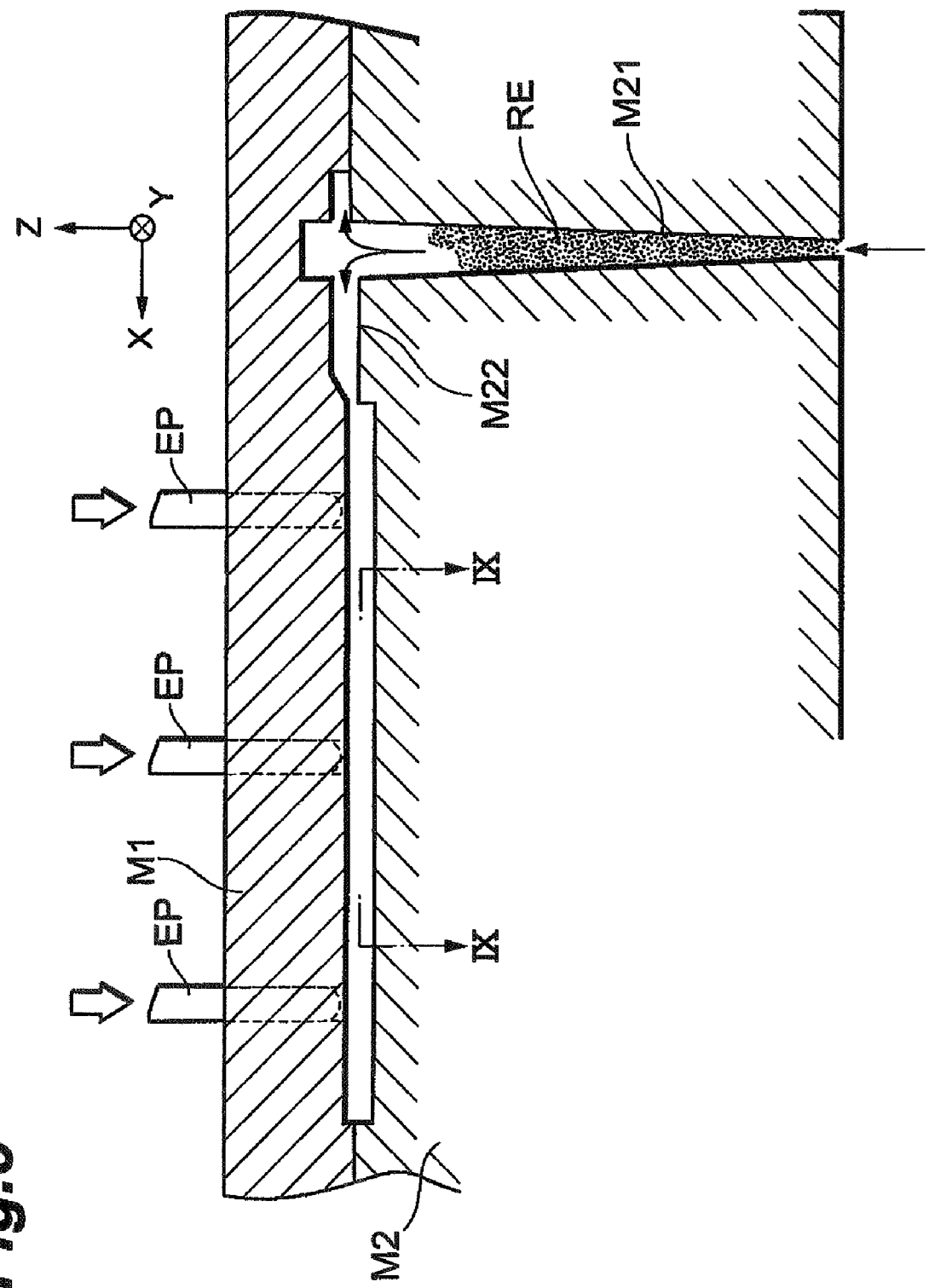
FIG. 8 is a longitudinal sectional view of a die for manufacturing the case for accommodating a solid-state imaging device.

FIG. 8 is a longitudinal sectional view of a die for manufacturing the case for accommodating a solid-state imaging device.

When achieving an injection molding, a resin RE is introduced between a first die M1 and a second die M2 having a cavity of the aforementioned case shape formed between the opposing surfaces thereof. The second die M2 has a tapered resin introducing pore M21 elongated in the direction Z, and has a communicating channel M22 elongated from a top of the resin introducing pore M21 in the direction X. The top of the communicating channel M22 composes a gate part, and the resin RE is introduced into the cavity, and then the resin flows in the cavity along the direction X. Therefore, when the resin RE is a liquid crystal polymer, an orientation of the high molecules composing the resin is aligned in the direction X.

After filling with the resin and solidifying, when a solidified resin is pushed toward the second die M2 with a plurality of ejector pins EP which has passed through the first die M1, the case for accommodating a solid-state imaging device is completed.

Figure 9:
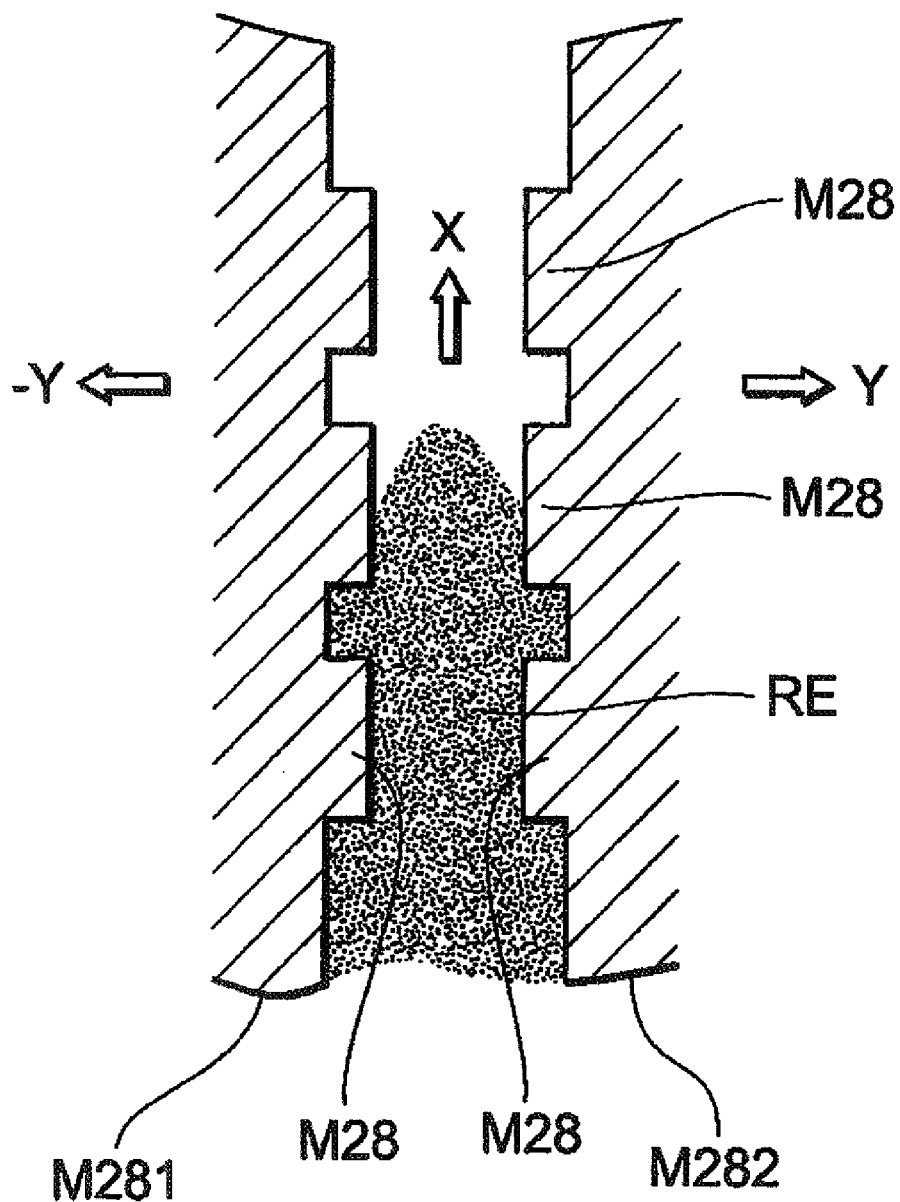
FIG. 9 is a sectional view of IX-IX arrow section of the die shown in FIG. 8.

FIG. 9 is a sectional view of IX-IX arrow section of the die shown in FIG. 8.

Besides, the plural depressions 28 for thinning shown in FIG. 5 are formed by a pair of side dies M281, M282 having a projecting part 28 at the aforementioned resin injection molding. At the injection molding, the resin RE runs in the direction X and is filled with the resin so that the depression 28 is formed, and after solidified, when the dies M1 and M2 are opened, the side dies M281, M282 move in the direction −Y, Y, respectively to separate the molded case for accommodating a solid-state imaging device from the dies M281, M282.

What is claimed is:

1. A case for accommodating a solid-state imaging device comprising:
   a case body made of a resin having a depression for accommodation to dispose a solid-state imaging device in the inside thereof and a longitudinal direction size of the case body is 3 or more times a width direction size;
   a plurality of lead terminals which are elongated from the inside of the depression for accommodation to the outside through a side wall running parallel to a longitudinal direction of the case body; and
   ribs made of a resin which are integrally formed with a bottom plate along a longitudinal direction of the bottom plate of the case body, the outermost bottom surface of the case forming a recess,
   wherein inner surfaces of said ribs face each other and are exposed to air, and there is a space between said inner surfaces;
   in the side wall, the width direction is assumed to be a depth direction, and the side wall has a plurality of depressions positioned along the longitudinal direction; and
   the case body and the ribs are made of a resin comprising a liquid crystal polymer and a filler comprising an inorganic material, wherein the filler comprises a plurality of fibrous bodies or needle-like bodies, and each of the fibrous bodies or needle-like bodies has an aspect ratio of not less than 5.

2. A solid-state imaging apparatus comprising:
   the case for accommodating a solid-state imaging device according to claim 1;
   the solid-state imaging device disposed in the depression for accommodation; and
   a transparent plate to close an opening of the depression for accommodation.

3. A case for accommodating a solid-state imaging device comprising:
   a case body made of a resin having a depression for accommodation to dispose a solid-state imaging device in the inside thereof and a longitudinal direction size of the case body is 3 or more times a width direction size;
   a plurality of lead terminals which are elongated from the inside of the depression for accommodation to the outside through a side wall running parallel to a longitudinal direction of the case body; and
   ribs made of a resin which are integrally formed with a bottom plate along a longitudinal direction of the bottom plate of the case body, the outermost bottom surface of the case forming a recess,
   wherein inner surfaces of said ribs face each other and are exposed to air, and there is a space between said inner surfaces;
   in the side wall, the width direction is assumed to be a depth direction, and the side wall has a plurality of depressions positioned along the longitudinal direction; and
   a total of the longitudinal lengths of the plural depressions is from 20% to 90% of the longitudinal length of the case body.

4. A solid-state imaging apparatus comprising:
   the case for accommodating a solid-state imaging device according to claim 3;
   the solid-state imaging device disposed in the depression for accommodation; and
   a transparent plate to close an opening of the depression for accommodation.

5. A case for accommodating a solid-state imaging device comprising:
   a case body made of a resin having a depression for accommodation to dispose a solid-state imaging device in the inside thereof and a longitudinal direction size of the case body is 3 or more times a width direction size;
   a plurality of lead terminals which are elongated from the inside of the depression for accommodation to the outside through a side wall running parallel to a longitudinal direction of the case body; and
   ribs made of a resin which are integrally formed with a bottom plate along a longitudinal direction of the bottom plate of the case body, the outermost bottom surface of the case forming a recess,
   wherein inner surfaces of said ribs face each other and are exposed to air, and there is a space between said inner surfaces;
   in the side wall, the width direction is assumed to be a depth direction, and the side wall has a plurality of depressions positioned along the longitudinal direction; and
   a total height b of the case body and the rib, and a width a of the case body satisfy the following equation:

$$1 \leq a/b \leq 2.5.$$

6. A solid-state imaging apparatus comprising:
   the case for accommodating a solid-state imaging device according to claim 5;
   the solid-state imaging device disposed in the depression for accommodation; and
   a transparent plate to close an opening of the depression for accommodation.

7. A case for accommodating a solid-state imaging device comprising:
   a case body made of a resin having a depression for accommodation to dispose a solid-state imaging device in the inside thereof and a longitudinal direction size of the case body is 3 or more times a width direction size;
   a plurality of lead terminals which are elongated from the inside of the depression for accommodation to the outside through a side wall running parallel to a longitudinal direction of the case body; and ribs made of a resin which are integrally formed with a bottom plate along a longitudinal direction of the bottom plate of the case body, the outermost bottom surface of the case forming a recess, wherein inner surfaces of said ribs face each other and are exposed to air, and there is a space between said inner surfaces;

in the side wall, the width direction is assumed to be a depth direction, and the side wall has a plurality of depressions positioned along the longitudinal direction; and a thickness h of the bottom plate of the case body, a width c of the rib, and each depth i of the plural depressions satisfy the following equation:

$$0.1 \leq i/(c+h) \leq 0.4.$$

8. A solid-state imaging apparatus comprising:

the case for accommodating a solid-state imaging device according to claim 7;

the solid-state imaging device disposed in the depression for accommodation; and a transparent plate to clolse an opening of the depression for accommodation.

9. A case for accommodating a solid-state imaging device comprising:

a case body made of a resin having a depression for accommodation to dispose a solid-state imaging device in the inside thereof and a longitudinal direction size of the case body is 3 or more times a width direction size;

a plurality of lead terminals which are elongated from the inside of the depression for accommodation to the outside through a side wall running parallel to a longitudinal direction of the case body; and ribs made of a resin which are integrally formed with a bottom plate along a longitudinal direction of the bottom plate of the case body, the outermost bottom surface of the case forming a recess, wherein inner surfaces of said ribs face each other and are exposed to air, and there is a space between said inner surfaces;

in the side wall, the width direction is assumed to be a depth direction, and the side wall has a plurality of depressions positioned along the longitudinal direction; and a thickness h of the bottom plate of the case body, and each width g of the plural depressions along the height direction of the case body satisfy the following equation:

$$0.7 \leq g/h \leq 1.5.$$

10. A solid-state imaging apparatus comprising:

the case for accommodating a solid-state imaging device according to claim 9;

the solid-state imaging device disposed in the depression for accommodation; and a transparent plate to close an opening of the depression for accommodation.

11. A case for accommodating a solid-state imaging device comprising:

a case body made of a resin having a depression for accommodation to dispose a solid-state imaging device in the inside thereof and a longitudinal direction size of the case body is 3 or more times a width direction size;

a plurality of lead terminals which are elongated from the inside of the depression for accommodation to the outside through a side wall running parallel to a longitudinal direction of the case body; and ribs made of a resin which are integrally formed with a bottom plate along a longitudinal direction of the bottom plate of the case body, the outermost bottom surface of the case forming a recess, wherein inner surfaces of said ribs face each other and are exposed to air, and there is a space between said inner surfaces;

in the side wall, the width direction is assumed to be a depth direction, and the side wall has a plurality of depressions positioned along the longitudinal direction; and a width c of the rib, and a height d of the rib satisfy the following equation:

$$0.5 \leq d/c \leq 2.0.$$

12. A solid-state imaging apparatus comprising:

the case for accommodating a solid-state imaging device according to claim 11;

the solid-state imaging device disposed in the depression for accommodation; and a transparent plate to close an opening of the depression for accommodation.

* * * * *